United States Patent [19]

Kondo et al.

[11] 4,088,516

[45] May 9, 1978

[54] METHOD OF MANUFACTURING A SEMICONDUCTOR DEVICE

[75] Inventors: Hiroyuki Kondo, Tokyo; Takahisa Nitta, Fuchu; Yoshiro Moriguchi, Kodaira, all of Japan

[73] Assignee: Hitachi, Ltd., Japan

[21] Appl. No.: 737,032

[22] Filed: Oct. 29, 1976

[30] Foreign Application Priority Data

Oct. 29, 1975 Japan .................. 50-129238

[51] Int. Cl.² .......................................... H01L 21/22
[52] U.S. Cl. .................................. 148/187; 148/175; 156/648
[58] Field of Search ............... 148/187, 175; 156/648

[56] References Cited

U.S. PATENT DOCUMENTS

| | | | |
|---|---|---|---|
| 3,755,001 | 8/1973 | Kooi et al. ........................ 148/1.5 |
| 3,832,202 | 8/1974 | Ritchie .......................... 106/287 SE |
| 3,892,608 | 7/1975 | Kuhn .............................. 148/175 |
| 3,900,350 | 8/1975 | Appels et al. ..................... 148/175 |
| 3,961,999 | 6/1976 | Antipov .......................... 148/174 X |
| 4,002,511 | 1/1977 | Magdo et al. ..................... 148/187 |

*Primary Examiner*—G. Ozaki
*Attorney, Agent, or Firm*—Craig & Antonelli

[57] ABSTRACT

A method of manufacturing a semiconductor device, comprises the steps of masking desired parts of a semiconductor substrate with a material which is impervious to an etchant for the substrate, exposing the substrate to the etchant to thereby etch substrate parts which lie directly beneath end parts of the etchant-impervious material and substrate parts which are not masked, applying a solution preferentially into the parts directly beneath the end parts of the etchant-impervious material among the etched substrate parts, the solution being capable of being converted into a semiconduct or oxide by a predetermined heat treatment, and heat-treating the substrate in order to oxidize the etched substrate surface parts.

19 Claims, 12 Drawing Figures

PRIOR ART
FIG. IA
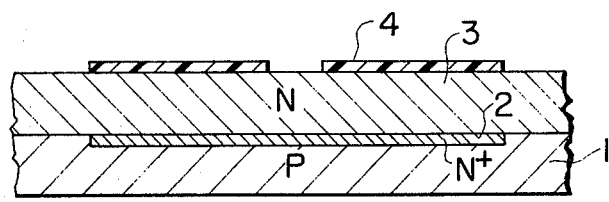
PRIOR ART   FIG. IB
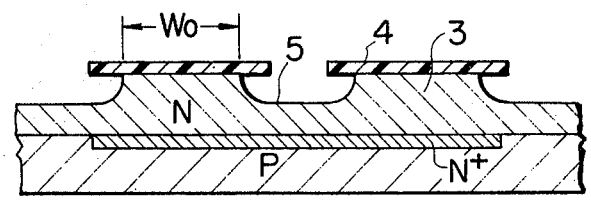
PRIOR ART   FIG. IC
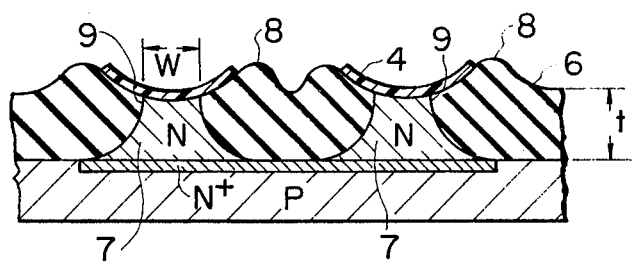

METHOD OF MANUFACTURING A SEMICONDUCTOR DEVICE

BACKGROUND OF THE INVENTION

1. Field of the Invention

The invention relates to a method of manufacturing a semiconductor device in which a large number of circuit element regions within a semiconductor substrate are insulated by an oxide.

2. Description of the Prior Art

In a semiconductor integrated circuit (hereinbelow, termed "IC"), a large number of circuit elements such as transistors, diodes and resistances are formed within a common semiconductor substrate. The circuit elements must be electrically isolated from one another by isolation regions. As one of expedients for the isolation, there has been proposed a method which uses an oxide and which is known as the so-called isoplanar technique. This method is such that a semiconductor oxide is formed in a region within a semiconductor substrate prearranged for the isolation by applying a local oxidation technique and it is employed as an isolation oxide film. The local oxidation technique is described in detail, for example, in the publication "Phillips Research Report," pages 118 – 132, issued by Philips Research Laboratory in April 1970.

FIGS. 1A to 1C illustrate an example in the case of manufacturing an IC by utilizing the isoplanar technique referred above.

First, as is shown in FIG. 1A, a P conductivity type silicon substrate 1 is prepared, an $N^+$-type buried layer 2 is formed in a surface portion of the substrate 1, and an N-type silicon layer 3 is thereafter formed by vapor growth. At a desired surface area of the layer 3, a film 4 of, for example, silicon nitride ($Si_3N_4$) is formed as a film which is impervious to an etchant for silicon. In forming the $Si_3N_4$ film 4, there can be employed a known method which exploits the vapor phase reaction between, for example, monosilane ($SiH_4$) and ammonia ($NH_3$). A silicon oxide ($SiO_2$) film is effectively formed between the silicon layer 3 and the silicon nitride film 4 in advance so as to prevent the silicon surface from becoming rough. The $Si_3N_4$ film 4 formed on the entire surface is selectively treated in an etchant such as phosphoric acid ($H_3PO_4$). Thus, an $Si_3N_4$ film 4 about 1,300A thick can be formed on only the desired parts as shown in FIG. 1A.

Subsequently, as shown in FIG. 1B, an etching treatment is carried out by immersing the resultant substrate in the etchant for silicon, for example, a mixed solution consisting of hydrofluoric acid (HF) and nitric acid ($HNO_3$). The etchant etches at substantially equal rates for the vertical direction and the lateral direction of the silicon layer 3. As a result, a recess 5 is etched-out so as to include portions directly beneath end parts of the silicon nitride film 4, as illustrated in FIG. 1B.

Subsequently, a heat treatment is carried out in an oxidizing atmosphere. Thus, as shown in FIG. 1C, the etched parts of the silicon layer 3 are selectively oxidized and converted into silicon oxide ($SiO_2$) 6, which electrically isolates a large number of circuit element regions 7 from one another.

During the oxidizing treatment, the oxide 6 rises at the end part of the silicon nitride film 4, and a protuberance 8, called a "bird head," is formed. The height of the protuberance becomes as large as about half of the thickness $t$ of the oxide 6. In the later stages of manufacture, accordingly, there occur such problems that wiring located on the surface of the protuberance is disconnected and that the close contact of a mask for a photolithographic processing becomes unstable. A protuberance 9, called a "bird beak," is also formed. The width W of the circuit element region 7, isolated by the oxide 6, is sharply decreased in comparison with the width $W_o$ before the selective oxidation treatment on account of the protuberance 9. Usually, the relation $W \approx W_o - 2t$ holds. As to the lateral dimension of the element region, therefore, the amount of decrease must be preestimated. As a consequence, enhancement of the density of integration cannot be expected.

SUMMARY OF THE INVENTION

It is an object of the invention to provide a method of manufacturing a semiconductor device which has an even surface.

Another object of the invention is to provide a method of manufacturing a semiconductor device whose density of integration is enhanced.

Still, another object of the invention is to provide a method of manufacturing a semiconductor device whose yield is enhanced.

Yet another object of the invention is to provide a method of manufacturing a semiconductor device of high reliability.

The fundamental technical idea of the invention for accomplishing such objects is that an oxidizing treatment is conducted so as to render the oxidizing rate in the lateral direction lower than that in the vertical direction, to thereby prevent substrate regions from unnecessarily decreasing. That is, according to the invention, prior to the oxidizing treatment, a solution capable of being converted into a semiconductor oxide by the succeeding heat treatment is preferentially applied to end parts of recesses in a substrate previously formed by etching, whereby oxidation in the lateral direction of the substrate is suppressed.

BRIEF DESCRIPTION OF THE DRAWING

FIGS. 1A to 1C are sectional views showing steps of a prior-art method of manufacture.

DETAILED DESCRIPTION OF THE INVENTION

Figure 2A:
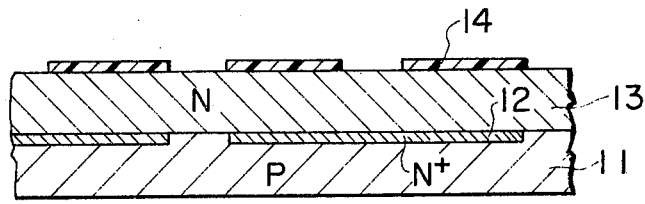
FIGS. 2A to 2E are sectional views showing an embodiment of the invention in the order of its steps.
Figure 2B:
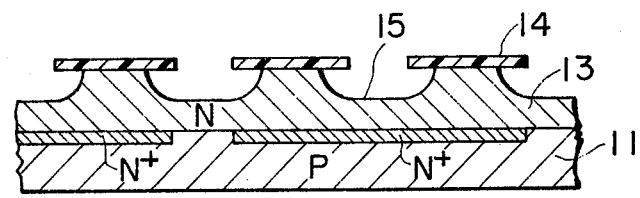
Figure 2C:
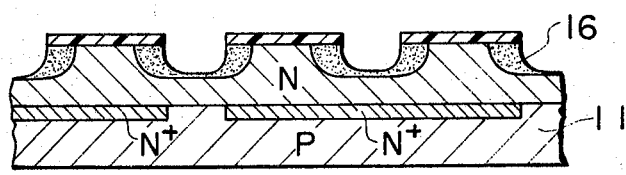
Figure 2D:
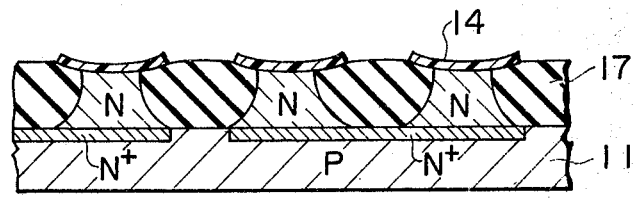
Figure 2E:
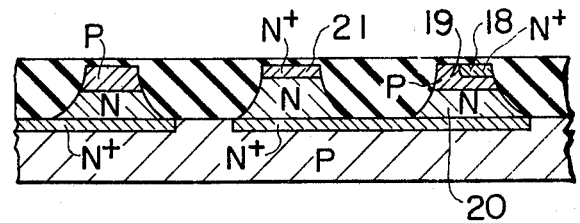

Referring to FIGS. 2A to 2E, a first embodiment of the invention will be explained.

Step (A): A P-type silicon substrate 11 having a specific resistance of 20 – 50Ω ·cm is prepared, and arsenic (As), is diffused into selected areas of the surface of the substrate to form $N^+$- type buried layers 12 each having a depth of 2.4μ, an impurity concentration of $4 \times 10^{19}$ atoms/$cm^3$ and a surface specific resistance of 30Ω/☐. Further, an N-type silicon layer 13 having a specific resistance of 0.2 – 0.3Ω · cm is formed on the resultant substrate to a thickness of 15,000 A by vapor growth (refer to FIG. 2A). Shown at 14 is a silicon nitride ($Si_3N_4$) film 1,500A thick, which is selectively formed on the silicon layer 13. The silicon nitride film 14 is one example of a film which is impervious to an etchant for silicon. Although no illustration is made in the figure, the silicon nitride film 14 is formed on a thermal oxidation film (of SiO$_2$) 1,000Å thick on the silicon layer 13 in order to prevent thermal distortion.

Step (B): The substrate 11 is immersed in the etchant for silicon, for example, an etchant containing hydrofluoric acid (HF) and nitric acid (HNO$_3$) at a ratio of 1:20. Thus, the silicon layer 13 which is not masked with the silicon nitride film 14 is selectively etched to form recesses 15. The amount of etching is about a half of the thickness of the silicon layer 13. The silicon layer at parts directly beneath end parts of the silicon nitride film 14 is also removed by the etching, whereby so-called pent roofs of the silicon nitride film 14 are formed (refer to FIG. 2B).

Both of the above steps can be executed by the processes as in the prior-art method, described with reference to FIGS. 1A and 1B.

Step (C): A vitreous solution 16 in which a silicon compound is dissolved in a suitable solvent, for example, alcohol is prepared. It is applied onto the surface of the substrate 11 with the substrate rotating at, for example, 7,000 r.p.m. The solution 16 is an alcoholic solution which employs a material having the property that it can be converted into a semiconductor oxide (for example, SiO$_2$) during the subsequent step of heat treatment, for example, O.C.D. (trade name of a coating composite produced by Tokyo Oka Kabushiki-Kaisha in Japan). Since the operation is carried out with the substrate 11 rotating, the vitreous solution 16 adheres preferentially to the end parts of the recesses in the substrate surface, i.e., directly beneath the pent roofs of the silicon nitride film 14 under the action of centrifugal forces (refer to FIG. 2C).

Basically, however, the rotation of the substrate 11 is not required during the application of the solution 16. More specificaly, since the preferential adherence of the solution 16 to the parts directly beneath the pent roofs of the silicon nitride film 14 is effected by the surfce tension of the solution 16 itself, it is successfully conducted by controlling the amount of the solution 16 even without rotating the substrate 11.

In the actual mass production process, the solution 16 is used in a somewhat larger quantity. As a consequence, the surplus solution directly adheres to the bottom surfaces of the recesses 15 considerably and also to the surface of the silicon nitride film 14 considerably, so that an inconvenience occurs at the subsequent step of oxidation. In general, accordingly, the substrate 11 is rotated during the application of the solution 16, whereby the centrifugal forces cause the solution accumulating on the bottom surfaces of the recesses 15 to be discharged to the exterior and the solution adhering to the surface of the silicon nitride film 14 is discharged to an outer peripheral part of the substrate 11. Then, the problem is eliminated. Even when the substrate 11 is rotated in this manner, the solution adhering directly beneath the pent roofs of the silicon nitride film 14 is not discharged to the exterior, and favorably the close adherence and the fineness of the solution are rather enhanced.

Step (D): The substrate 11 is heated at 200° C for 20 minutes, to vaporize the solvent in the solution 16. Thereafter, a heat treatment is conducted in an oxidizing atmosphere at 1,000° C for 16 hours again. Thus, the solution 16 is converted into a semiconductor oxide (SiO$_2$) film. Simultaneously therewith, the remaining etched silicon layer 13 is oxidized down to the buried layer 12, to form an oxide (SiO$_2$) 17. When the silicon layer 13 is converted into the oxide 17, the volume approximately doubles. Therefore, the surfce of the oxide 17 comes to a position substantially equal to the surface of the original silicon layer 13. Due to the presence of the solution 16 before the oxidation and the silicon nitride (Si$_3$N$_4$) film, growth of the oxide in the lateral direction is suppressed. Therefore, the oxide grows substantially in the vertical direction only (refer to FIG. 2D).

Step (E): The silicon nitride film 14 is etched and removed from the substrate surface with heated phosphoric acid (H$_3$PO$_4$). Further, a thin SiO$_2$ film having been formed beneath the silicon nitride film 14 is etched and removed with a mixed etchant consisting of hydrofluoric acid (HF) and ammonium fluoride (NH$_4$F). The exposed substrate surface is doped with desired impurities, to form a desired circuit element (refer to FIG. 2E). As an example of forming an N-P-N transistor, numeral 18 designates an emitter region which is formed by diffusing phosphorus and which has a depth of 0.45$\mu$ and an impurity concentration of $10^{21}$ atoms/cm$^3$, numeral 19 is a base region which is formed by diffusing boron and which has a depth of 0.75 $\mu$ and an impurity concentration of $10^{19}$ atoms/cm$^3$, and numeral 20 is a collector region. Shown at 21 is a high concentration region for leading out a collector electrode, which region is formed by diffusion simultaneously with the emitter region. The base region 19 is formed by diffusion by employing the oxide 17 as a mask. The emitter region 18 is formed by selective diffusion by employing, as a mask, a thin SiO$_2$ film formed at the formation of the base region 19. The respective regions are thereafter formed with aluminum electrodes by the conventional method.

As is apparent from the above description, according to the invention, in performing the local oxidation treatment, the solution containing the semiconductor compound is applied preferentially to the end parts of the recess previously formed by the etching, and the solution is vitrified, whereupon local oxidation treatment is performed. Therefore, the growth of the oxide in the lateral direction of the substrate is suppressed by the presence of the vitrified solution, and the oxide can be grown substantially in the vertical direction only. As a result, the surface of the grown oxide is substantially flat, and the height of the bird head is small. Accordingly, the problem of the disconnection of the electrode wiring, the problem of the instability of the contact of the mask for the photolithographic processing, etc., can be obviated.

Since the growth of the oxide in the lateral direction is suppressed, the dimensions W$_o$ and W of the circuit element forming region before and after the local oxidation treatment have almost no difference therebetween. It becomes unnecessary, as in the prior art, to provide an extra area by previously estimating the component of the decrease of the width attributed to the bird beak to be created by the oxidation. Accordingly, enhancement of the density of integration can be expected, and the manufacture of an IC or LSI of a high density of integration is enabled.

Furthermore, since the shape of the bird head portion can be made gradual, the thickness of the oxide for the isolation can be made smaller than in the prior art. As a result, streses which arise in the vicinity of the bird head portion (thermal stresses which develop in the silicon step — SiO$_2$ — Si$_3$N$_4$) are decreased, and crystal defects in the surface of the silicon layer are decreased so that enhancement of the yield of the elements can be expected. The solution is not restricted to the examples given in the above embodiment, but liquid glasslike materials in which various glass components are dissolved in solvents can generally be employed similarly. Preferably however, the material should be of components having no masking action on oxygen under the state in which it has been converted into a solid insulator by subsequent heat treatment.

According to the invention, the growth of the oxide in the lateral direction may well be suppressed by a method to be described hereunder. Reference will now be had to FIGS. 3A to 3D. In accordance with this embodiment, it is also possible to prevent a parasitic channel between the N$^+$- type buried layers 12.

After carrying out Step (B) of the foregoing embodiment, the surface of the P conductivity type silicon substrate 1 is thinly subjected to light oxidation, to form an SiO$_2$ film 30. By way of example, the thickness of the SiO$_2$ film is 2,000 – 2,500A. Thereafter, a positive type photoresist is applied while rotating the substrate, and an X-ray or electron beam exposure (as indicated by arrows) is performed (refer to FIG. 3A).

Figure 3A:
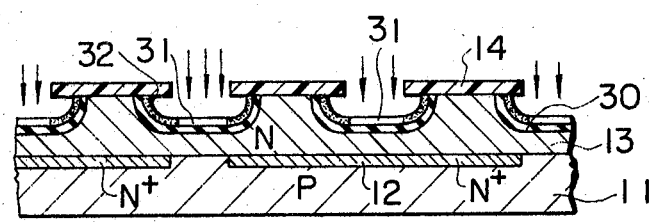
FIGS. 3A to 3D are sectional views showing another embodiment of the invention in the order of its steps.
Figure 3B:
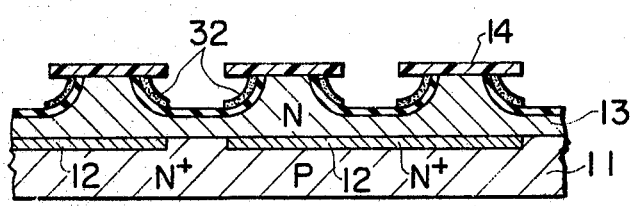
Figure 3C:
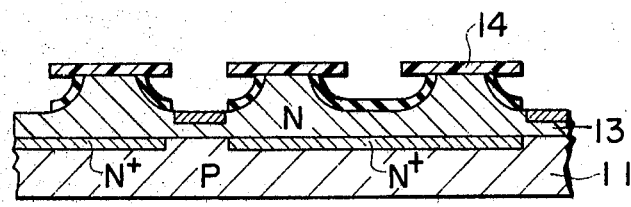

Subsequently, a photoresist film 31 subjected to the exposure is removed, to leave a photoresist film 32 at parts not subjected to the exposure due to the masks of the pent roof parts of the silicon nitride film 14 (refer to FIG. 3B).

Subsequently, using the photoresist film 32 as a mask, the SiO$_2$ film 30 is selectively etched and removed with a mixed etchant consisting of hydrofluoric acid (HF) and ammonium fluoride (NH$_4$F), to expose the surface of the silicon layer 13. In order to form a region for preventing a parasitic channel, boron, which is a P-type impurity and which is at a high concentration, is deposited onto the exposed surface of the silicon layer 13 (refer to FIG. 3C).

Figure 3D:
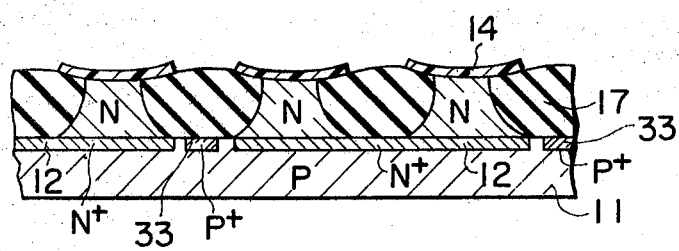

Under such a state, the substrate 11 is heat-treated in an oxidizing atmosphere at 1,000° C for 16 hours. Thus, the silicon layer 13 is oxidized down to the buried layer 12, to form the oxide (SiO$_2$) 17 (refer to FIG. 3D). Simultaneously with the oxidation, the boron deposited on the surface of the silicon layer 13 is diffused, with the result that the P$^+$ - type channel preventing region 33 which has a lower specific resistance than the substrate 11, is formed between the N$^+$ - type buried layers 12 as illustrated in FIG. 3D.

Thereafter, circuit elements are formed as in Step (E) of the foregoing embodiment.

Also, in this embodiment, the oxide film 30 is previously formed directly beneath the pent roof part of the silicon nitride film 14, so that in forming the oxide film 17 for the isolation, oxygen does not readily enter. Therefore, the growth of the oxide in the lateral direction is suppressed, and the same purposes as in the foregoing embodiment are achieved. As compared with the foregoing embodiment, however, the present embodiment undergoes a small growth of the oxide in the lateral direction and is formed with the bird heads and the bird beaks.

While we have shown and described several embodiments in accordance with the present invention, it is understood that the same is not limited thereto but is susceptible of numerous changes and modifications as known to a person skilled in the art, and we therefore do not wish to be limited to the details shown and described herein but intend to cover all such changes and modifications as are obvious to one of ordinary skill in the art.

We claim:

1. In a method of manufacturing a semiconductor device, the improvement for which includes the steps of:
   (a) forming on a surface of a semiconductor substrate of a first conductivity type a semiconductor layer of a second conductivity type opposite to the conductivity type of said semiconductor substrate,
   (b) masking desired parts of a surface of said semiconductor layer with a material which is impervious to an etchant for said semiconductor layer,
   (c) exposing said semiconductor layer to the etchant, to thereby etch semiconductor layer parts which lie directly beneath end parts of the etchant-impervious material and semiconductor layer parts which are not masked so as to form recesses in said semiconductor layer,
   (d) causing a solution to preferentially adhere to end parts of said recesses directly beneath said end parts of said etchant-impervious material, said solution being capable of conversion into a semiconductor oxide by a predetermined heat treatment, and
   (e) oxidizing said semiconductor layer from the etched semiconductor layer surface parts down to said semiconductor substrate by subjecting the resultant semiconductor device to said heat treatment.

2. The improvement according to claim 1, wherein said semiconductor substrate and said semiconductor layer are made of silicon, respectively.

3. The improvement according to claim 1, wherein said etchant-impervious material is a silicon nitride film.

4. The improvement according to claim 1, wherein at the step (a), buried regions of the conductivity type opposite to that of said semiconductor substrate are formed in the semiconductor substrate directly beneath said desired parts at which said etchant-impervious material is to be formed, whereupon said semiconductor layer is formed.

5. The improvement according to claim 4, wherein said semiconductor layer is oxidized down to said buried regions.

6. The improvement according to claim 1, wherein at the step (c), said semiconductor layer is etched to substantially half the thickness of said semiconductor layer.

7. The improvement according to claim 1, wherein at step (d), said solution capable of being converted into said semiconductor oxide is caused to preferentially adhere to said end parts of said recesses by rotational application into said end parts directly beneath said end parts of said etchant-impervious material.

8. The improvement according to claim 7, wherein said rotational application creates centrifugal forces causing said solution to adhere to said end parts of said recesses only directly beneath said end parts of said etchant-impervious material.

9. The improvement according to claim 1, wherein said solution is caused to adhere to said end parts of said recesses only directly beneath said end parts of said etchant-impervious material.

10. In a method of manufacturing a semiconductor device, the improvement for which includes the steps of:
   (a) masking desired parts of a semiconductor substrate with a material which is impervious to an etchant for said substrate, (b) exposing said substrate to the etchant, to thereby etch substrate parts which lie directly beneath end parts of etchant-impervious material and substrate parts which are not masked so as to form recesses in said substrate, (c) causing a solution to preferentially adhere to end parts of said recesses directly beneath said end parts of said etchant-impervious material, said solution being capable of being converted into a semiconductor oxide by a predetermined heat treatment, and (d) subjecting the resultant substrate to the heat treatment in order to oxidize the etched substrate surface parts.

11. The improvement according to claim 10, wherein at step (c), said solution capable of being converted into said semiconductor oxide is caused to preferentially adhere to said end parts of said recesses by rotational application into said end parts directly beneath said end parts of said etchant-impervious material.

12. The improvement according to claim 11, wherein said solution is caused to adhere to said end parts of said recesses only directly beneath said end parts of said etchant-impervious material.

13. The improvement according to claim 11, wherein said solution is a vitreous solution containing a silicon compound dissolved in a volatile liquid.

14. The improvement according to claim 13, wherein said voltatile liquid is alcohol.

15. The improvement according to claim 10, wherein said solution is caused to adhere to said end parts of said recesses only directly beneath said end parts of said etchant-impervious material.

16. In a method of manufacturing a semiconductor device the improvement for which includes the steps of:

(a) forming, within a semiconductor substrate of a first conductivity type, a plurality of first regions of a second conductivity type opposite to the conductivity type of said semiconductor substrate, (b) forming a semiconductor layer of the same conductivity type as that of said first regions on the entire surface of said semiconductor substrate, (c) masking a surface of said semiconductor layer with a material which is impervius to an etchant for said semiconductor layer, (d) exposing said semiconductor layer to the etchant, to thereby etch semiconductor layer parts which lie directly beneath end parts of the etchant-impervious material and semiconductor layer parts which are not masked, (e) subjecting the surface of the etched semiconductor layer to oxidation by employing said etchant-impervious material as a mask, to thereby form a thin oxide film, (f) causing a photoresist film to adhere onto a surface of said thin oxide film by rotational application, (g) subjecting said photoresist film to exposure by employing said etchant-impervious material as a mask, and removing the photoresist film subjected to the exposure, (h) etching and removing said thin oxide film by employing the remaining photoresist film as a mask, to thereby expose the surface of said semiconductor layer, (i) oxidizing said semiconductor layer from the exposed surface parts thereof down to said semiconductor substrate, and (j) removing said etchant-impervious material to expose the semiconductor layer surface, and forming circuit elements within the exposed semiconductor layer.

17. The improvement according to claim 16, further including, between the steps (h) and (i), the step of (k) depositing an impurity of said first conductivity type onto that exposed surface of said semiconductor layer which lies above and between said first regions, said impurity being spread and diffused by heating at the oxidation treatment of the step (i), thereby to form a second region which has a specific resistance lower than that of said semiconductor substrate.

18. In a method of manufacturing a semiconductor device, the improvement for which includes the steps of:

(a) masking desired parts of a semiconductor substrate with a material which is impervious to an etchant for said substrate, (b) exposing said substrate to the etchant to etch surface portions of said substrate which are free of said material and to etch portions of said substrate which lie directly beneath end parts of said material, thereby forming recesses in said substrate and end parts of said recesses directly underlying said end parts of said material, (c) vitrifying said end parts of said recesses directly underlying said end parts of said material by a predetermined oxidizing heat treatment, and (d) continuing said heat treatment until the etched substrate surface portions are completely oxidized, wherein the vitrified end parts of said recesses suppress oxidation of said substrate at said end parts of said recesses.

19. The improvement according to claim 18, wherein the step (c) is carried out by applying a vitreous solution only to said end parts of said recesses directly underlying said end parts of said material, and by heating said vitreous solution during said heat treatment, thereby forming said vitrified end parts of said recesses.

* * * * *